United States Patent
Beausoleil et al.

(10) Patent No.: US 6,901,359 B1
(45) Date of Patent: May 31, 2005

(54) HIGH SPEED SOFTWARE DRIVEN EMULATOR COMPRISED OF A PLURALITY OF EMULATION PROCESSORS WITH A METHOD TO ALLOW HIGH SPEED BULK READ/WRITE OPERATION SYNCHRONOUS DRAM WHILE REFRESHING THE MEMORY

(75) Inventors: William F. Beausoleil, Hopewell Junction, NY (US); R. Bryan Cook, Poughkeepsie, NY (US); Tak-kwong Ng, Hyde Park, NY (US); Helmut Roth, Hopewell Junction, NY (US); Peter Tannenbaum, Woodstock, NY (US); Lawrence A. Thomas, West Hurley, NY (US); Norton J. Tomassetti, Kingston, NY (US)

(73) Assignee: Quickturn Design Systems, Inc., San Jose, CA (US)

( * ) Notice: Subject to any disclaimer, the term of this patent is extended or adjusted under 35 U.S.C. 154(b) by 782 days.

(21) Appl. No.: 09/656,541

(22) Filed: Sep. 6, 2000

(51) Int. Cl.⁷ .................. G06F 9/455; G06F 15/00; G06F 15/76; G06F 12/00; G06F 12/14
(52) U.S. Cl. .................. 703/24; 703/23; 703/28; 712/10; 712/11; 711/147; 711/151
(58) Field of Search ................ 703/23, 24, 28; 712/10, 11; 711/147, 151

(56) References Cited

U.S. PATENT DOCUMENTS

| | | | | |
|---|---|---|---|---|
| 4,087,794 A | * | 5/1978 | Beausoleil et al. | 703/24 |
| 5,551,013 A | | 8/1996 | Beausoleil et al. | |
| 5,754,557 A | * | 5/1998 | Andrewartha | 714/718 |
| 6,051,030 A | * | 4/2000 | Beausoleil et al. | 703/28 |
| 6,078,338 A | * | 6/2000 | Horan et al. | 345/535 |
| 6,226,709 B1 | * | 5/2001 | Goodwin et al. | 711/106 |
| 6,260,127 B1 | * | 7/2001 | Olarig et al. | 711/167 |
| 6,330,645 B1 | * | 12/2001 | Harriman | 711/151 |
| 6,381,715 B1 | * | 4/2002 | Bauman et al. | 714/718 |
| 6,618,698 B1 | * | 9/2003 | Beausoleil et al. | 703/23 |
| 6,678,838 B1 | * | 1/2004 | Magro | 714/42 |

OTHER PUBLICATIONS

Chang, Hong–Kai et al. "Array Allocation Taking Into Account SDRAM Characteristics". Proc. of the 2000 Asia South Pacific DAC. Jan., 2000. pp. 497–502.*
Hobson, R. et al. "A Parallel Embedded–Processor Architecture for ATM Reassembly". IEEE/ACM Transactions on Networking. 1999. pp. 23–37.*
Kreeger, K. et al. "Hybrid Volume and Polygon Rendering with Cube Hardware". Proc. ACM SIGGRAPH/Eurographics. 1999. pp. 15–24.*

* cited by examiner

Primary Examiner—Kevin J. Teska
Assistant Examiner—Ayal Sharon
(74) Attorney, Agent, or Firm—Orrick, Herrington & Sutcliffe LLP

(57) ABSTRACT

A system and method for bulk transfer to and from the SRAMs in which a starting memory address is latched and is then incremented every clock cycle to generate a new memory address. The addresses are decoded and memory requests are pipelined to the SRAM memory, one every clock cycle. When the memory controller detects transfer of the boundary of a predetermined number of clock cycles or words (e.g. 64 words or four clock cycles) the burst mode of data transfer is stopped and the memory controller waits for a "done" signal before resuming another cycle of the burst transfer mode. The memory controller on detecting a request on this address boundary first does a memory refresh followed by a requested operation; e.g. a continuation of the transfer operation.

6 Claims, 2 Drawing Sheets

HIGH SPEED SOFTWARE DRIVEN EMULATOR COMPRISED OF A PLURALITY OF EMULATION PROCESSORS WITH A METHOD TO ALLOW HIGH SPEED BULK READ/WRITE OPERATION SYNCHRONOUS DRAM WHILE REFRESHING THE MEMORY

CROSS REFERENCE TO RELATED APPLICATIONS

The following copending applications, assigned to the assignee of the present invention, contain common disclosure and are incorporated herein by reference in their entireties:

"High Speed Software Driven Emulator Comprised of a Plurality of Emulation Processors with Improved Board-to-Board Interconnection Cable Length Identification System," Ser. No. 09/655,595, filed Sep. 6, 2000.

"High Speed Software Driven Emulator Comprised of a Plurality of Emulation Processors with an Improved Maintenance Bus that Streams Data at High Speed," Ser. No. 09/656,147, filed Sep. 6, 2000.

"High Speed Software Driven Emulator Comprised of a Plurality of Emulation Processors with a Method to Allow Memory Read/Writes Without Interrupting the Emulation," Ser. No. 09/655,596, filed Sep. 6, 2000.

"High Speed Software Driven Emulator Comprised of a Plurality of Emulation Processors with Improved Multiplexed Data Memory," Ser. No. 09/656,146, filed Sep. 6, 2000.

FIELD OF THE INVENTION

This invention relates to a software driven emulator comprised of a large number of single bit processors operating in parallel to execute, at high speed, an emulation of a complex processor, and more particularly, to a system and method for high-speed streaming of bulk read and write operations from and to the synchronous DRAM module memories in order to support a simulation-accelerate mode of operation.

TRADEMARKS

S/390 and IBM are registered trademarks of International Business Machines Corporation, Armonk, N.Y., U.S.A. and Lotus is a registered trademark of its subsidiary Lotus Development Corporation, an independent subsidiary of International Business Machines Corporation, Armonk, N.Y. Other names may be registered trademarks or product names of International Business Machines Corporation or other companies.

BACKGROUND

The usefulness of software driven emulators has increased enormously with growth in the complexity of integrated circuits. Basically, an emulation engine operates to mimic the logical design of a set of one or more integrated circuit chips. The emulation of these chips in terms of their logical design is highly desirable for several reasons. The utilization of emulation engines has also grown up with and around the corresponding utilization of design automation tools for the construction and design of integrated circuit chip devices. In particular, as part of the input for the design automation process, logic descriptions of the desired circuit chip functions are provided. The existence of such software tools for processing these descriptions in the design process is well suited to the utilization of emulation engines which are electrically configured to duplicate the same logic function that is provided by a design automation tool.

Utilization of emulation devices permits testing and verification via electrical circuits of logic designs before these designs are committed to a socalled "silicon foundry" for manufacture. The input to such foundries is the functional logic description required for the chip and its output is initially a set of photolithographic masks which are then used in the manufacture of the desired electrical circuit chip device. Verifying that logic designs are correct in the early stage of chip manufacturing eliminates the need for costly and timeconsuming second passes through a silicon foundry.

Another advantage of emulation systems is that they provide a device that makes possible the early validation of software meant to operate the emulated chips. Thus, software can be designed, evaluated and tested well before the time when actual circuit chips become available. Additionally, emulation systems can also operate as simulator-accelerator devices thus providing a high-speed simulation platform.

Emulation engines of the type contemplated by this invention contain an interconnected array of emulation processors (EP). Each emulation processor (hereinafter, also sometimes simply referred to as "processor") can be programmed to evaluate logic function (for example, AND, OR, XOR, NOT, NOR, NAND, etc.). The program driven processors operate together as an interconnected unit, emulate the entire desired logic design. However, as integrated circuit designs grow in size, more emulation processors are required to accomplish the emulation task. An aim, therefore, is to increase the capacity of emulation engines in order to meet the increasingly difficult task of emulating more and more complex circuits and logic functions by increasing the number of emulation processors in each of its modules.

For purposes of better understanding the structure and operation of emulation devices generally, and this invention particularly, U.S. Pat. No. 5,551,013 and patent application Ser. No. 09/373,125 filed Aug. 12, 1999, both of which are assigned to the assignee of this application, are hereby incorporated herein by reference.

U.S. Pat. No. 5,551,013 shows an emulation chip, called a module here, having multiple (e.g. 64) processors. All processors within the module are identical. The sequencer and the interconnection network occurs only once in a module. The control stores hold a program created by an emulation compiler for a specified processor. The stacks hold data and inputs previously generated and are addressed by fields in a corresponding control word to locate the bits for input to the logic element. During each step of the sequencer an emulation processor emulates a logic function according to the emulation program. A data flow control interprets the current control word to route and latch data within the processor. The node-bit-out signal from a specified processor is presented to the interconnection network where it is distributed to each of the multiplexors (one for each processor) of the module. The node address field in the control word allows a specified processor to select for its node-bit-in signal the node-bit-out signal from any of the processors within its module. The node bit is stored in the input stack on every step. During any operation the node-bit-out signal of a specified processor may be accessed by none, one, or all of the processors within the module.

Data routing within each processor's data flow and through the interconnection network occurs independently of and overlaps the execution of the logic emulation function in each processor. Each control store stores control words executed sequentially under control of the sequencer and program steps in the associated module. Each revolution of the sequencer causes the step value to advance from zero to a predetermined maximum value and corresponds to one target clock cycle for the emulated design. A control word in the control store is simultaneously selected during each step of the sequencer. A logic function operation is defined by each control word.

Each of these emulation processors has an execution unit for processing multiple types of logic gate functions. Each emulation processor switches from a specified one logic gate function to a next logic gate function in a switched-emulation sequence of different gate functions. The switched-emulation sequence of each of the processors thus can emulate a subset of gates in a hardware arrangement in which gates are of any type that the emulation processors functionally represent for a sequence of clock cycles. The processors are coupled by a like number of multiplexors having outputs respectively connected to the emulation processors of a module and having inputs respectively connected to each of the other emulation processors. The bus connected to the multiplexors enables an output from any emulation processor to be transferred to an input of any other of the emulation processors. In accordance with the teachings of the pending application, the basic design of the U.S. Pat. No. 5,551,013 patent is improved by interconnecting processors into clusters. With interconnected clusters, the evaluation phases can be cascaded and all processors in a cluster perform the setup and storing of results in parallel. This setup includes routing of the data through multiple evaluation units for the evaluation phase. For most efficient operation, the input stack and data stack of each processor must be stored in shared memory within each cluster. Then, all processors perform the storage phase, again in parallel. The net result is multiple cascaded evaluations performed in a single emulation step. Every processor in a cluster can access the input and data stacks of every other processor in the cluster and less space on each module chip for the functions that support the processor operation, particularly the memory functions.

As will be appreciated by those skilled in the art, emulators of the type described above have evolved to perform not only in a traditional emulation mode but also in a simulation-accelerate mode. In this simulation-accelerate mode, there is a requirement to upload and download large quantities of data from the system SDRAMs for the data capture function of the simulation-accelerate operating mode.

In the prior art emulators, such as the ET 3.5 and ET 3.7 emulators, the protocol for writing data to and reading data from SDRAMS requires a hand shake protocol. A word is transferred from or to the SDRAM only in response to a "done" signal from the memory signaling that the previous transfer operation has been completed. The "done" signal is required in these prior art systems to account for the case where the previous transfer operation was delayed by a memory refresh operation. Such prior art protocols slow the bulk transfer of data to and from an SDRAM memory.

SUMMARY OF THE INVENTION

An object of this invention is the provision of a system and method for rapidly transferring large quantities of data to and from SDRAM memories in an emulator in order to support simulation-acceleration operating mode.

Briefly, this invention contemplates the provision of a system and method for bulk transfer to and from the SRAMs in which a starting memory address is latched and is then incremented every clock cycle to generate a new memory address, as described more extensively in copending application Ser. No. 09/655,596 filed Sep. 6, 2000 and assigned to the assignee of this application. The addresses are decoded and memory requests are pipelined to the SRAM memory, one every clock cycle. When the memory controller detects transfer of the boundary of a predetermined number of clock cycles or words (e.g. 64 words or four clock cycles) the burst mode of data transfer is stopped and the memory controller waits for a "done" signal before resuming another cycle of the burst transfer mode. The memory controller on detecting a request on this address boundary first does a memory refresh followed by a requested operation; e.g. a continuation of the transfer operation.

DESCRIPTION OF THE DRAWINGS

The foregoing and other features and advantages of the invention will be described with reference to the accompanying drawings. In the drawings, like reference numbers generally indicate identical, functionally similar, and/or structurally similar elements. Also in the figures, the left most digit of each reference number corresponds to the figure in which the reference number is first used.

DETAILED DESCRIPTION OF THE INVENTION

Figure 1:
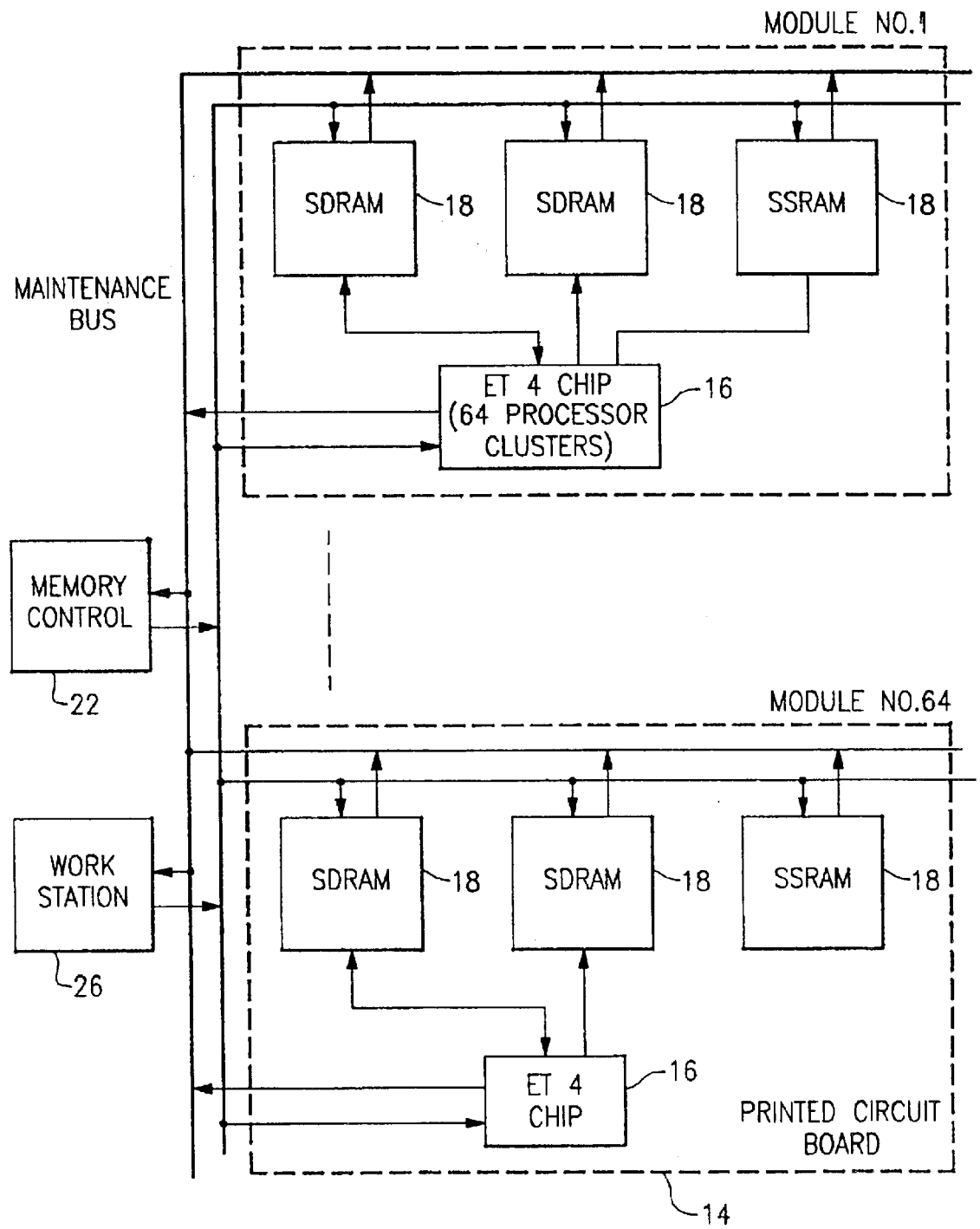
FIG. 1 is a high level block diagram of two of 64 modules on an emulator board of the type to which this invention is applicable.

Referring now to FIG. 1, each board 14 of the emulation processor in this exemplary embodiment has sixty-four modules 12, two of which are illustrated in FIG. 1. Each module has an E4 chip 16, which includes sixty-four single-bit processors. Each module has a main memory 18 comprised of two SDRAMs and a single SSRAM. These memories communicate internally with the E4 chip 16 on the module to which these memories are attached, via an internal module bus. A maintenance bus connects these module main memories to other modules on the same board, to modules on other boards, and to a work station 26, which serves the entire emulation engine. There is one memory controller 22 for each board. The memory controller 22 interfaces the reading and writing of data from and into the SDRAMs and SSRAMs in a data capture mode of operation in which bulk transfers of data between the work station and the SDRAMs and SSRAMs are carried out via the maintenance bus.

For bulk transfers in accordance with the teachings of this invention, a latch is set by one of the ET4 control stores to inhibit further transfers between the ET4 processor chip and the SDRAMs on the module, as described in detail in copending application Ser. No. 09/655,596. The memory controller 22 includes incrementing logic into which a starting SDRAM address is inserted when the emulator is to perform a bulk data transfer operation. This memory address is incremented by "1" in response to each clock signal. Similarly, with the latch set, the memory controller makes a memory request (i.e. read or write) to the incremented address in response every clock cycle. Periodically, the memory controller, after making a memory request, waits for the memory "done" return before making the next memory request. This periodic pause in the streamed bulk memory transfer allows time for the SDRAM refresh cycle, the completion of which is signaled by the "done" return signal. As will be appreciated by those skilled in the art, the minimum frequency at which there is a pause in the bulk streaming operation is a function of the frequency at which the SDRAM must be refreshed. In one specific example, an emulator of the type described herein uses commercially available SRAMs, has a clock cycle of 90 ns, and transfers data to and from the SDRAM on each clock cycle as a sixteen-bit word for each memory address. The memory controller detects each 64 word boundary and stops the burst mode of data transfer while the controller waits for a "done" return from the memory in order to resume the burst mode. Upon detecting the 64 word boundary, the memory controller initiates a refresh cycle.

Figure 2:
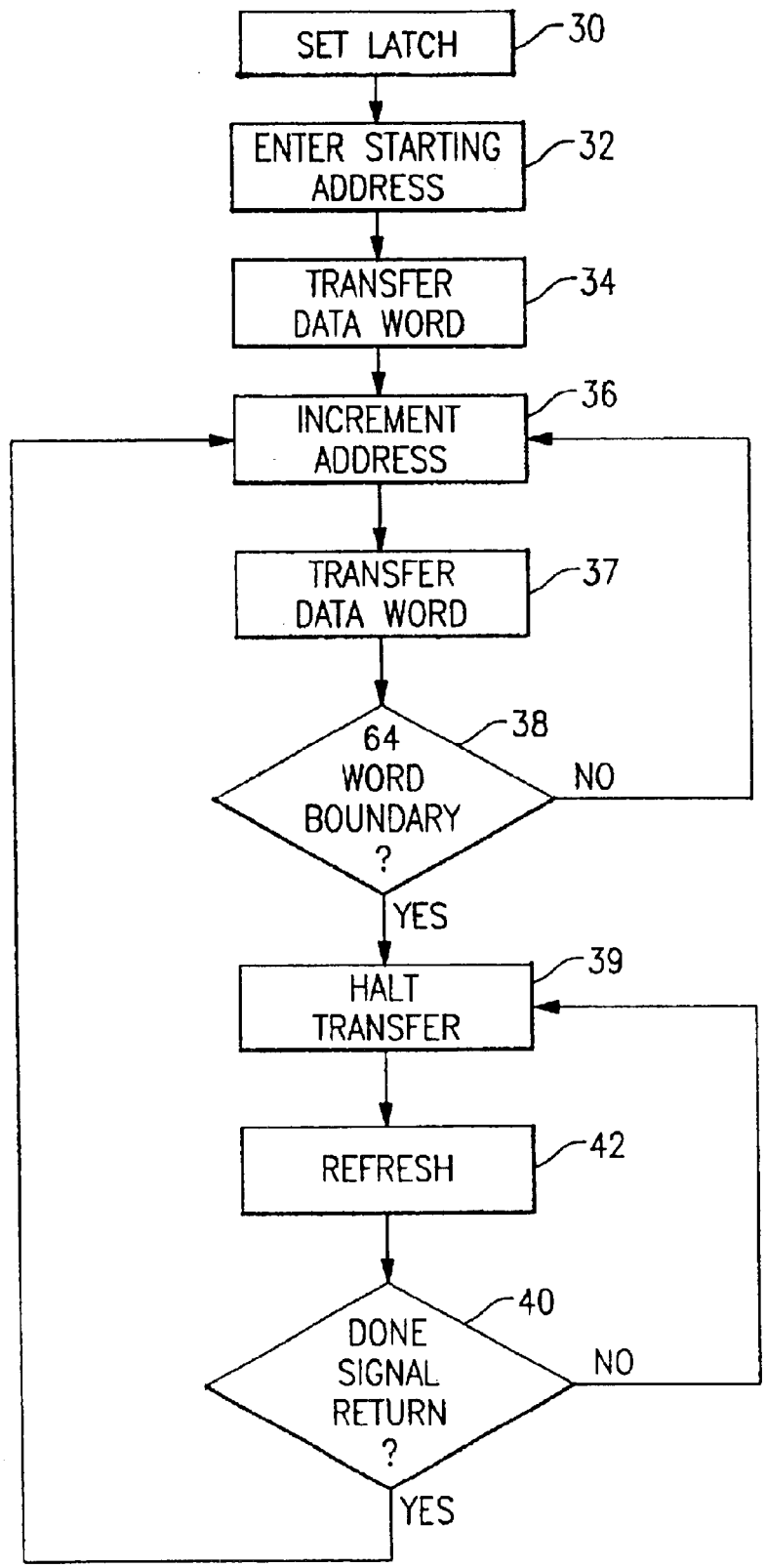
FIG. 2 is a flow diagram of the method steps of this invention.

Referring now to FIG. 2 of the drawings, in a bulk data transfer to the module memories, a latch is set (block 30) and a starting address is entered into a register of the memory controller (block 32). A sixteen bit data word is transferred each clock cycle (block 34) the address is incremented (block 36) and another word is transferred to or from this incremented address on the next clock cycle (block 37). After a predetermined number of clock cycles or on a predetermined word boundary (e.g. on each 64 word boundary) (block 38) the bulk transfer is halted while the memory controller waits for a "done" return (block 40). When the "done" (block 39) signal is returned, the controller resumes the streaming mode of operation, which continues until the next 64 word boundary is detected.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. In a software driven emulator comprised of a plurality of printed circuit boards each having a module, each of said modules including a processor chip and at least one SDRAM coupled to the processor chip, a maintenance bus coupled to said SDRAM, and a memory controller coupled to said maintenance bus, a method of executing bulk data transfers to said SDRAM via said maintenance bus, comprising:

setting a latch in said memory controller to halt data transfer between said SDRAM and said processor chip, said processor chip including a plurality of emulation processors;

transferring data in bursts to said SDRAM from the plurality of emulation processors via said maintenance bus on each clock cycle for a predetermined number of clock cycles in succession;

halting the transfer of data after said predetermined number of clock cycles;

initiating a SDRAM refresh cycle after said halting;

resuming said transferring data in bursts upon receipt of a done signal after said refresh cycle.

2. In a software driven emulator comprised of a plurality of printed circuit boards each having a module, each of said modules including a processor chip and at least one SDRAM coupled to the processor chip, a maintenance bus coupled to said SDRAM, and a memory controller coupled to said maintenance bus, a method of executing bulk data transfers from said SDRAM via said maintenance bus, comprising:

setting a latch in said memory controller to halt data transfer between said SDRAM and said processor chip, said processor chip including a plurality of emulation processors;

transferring data in bursts from said SDRAM to the plurality of emulation processors via said maintenance bus on each clock cycle for a predetermined number of clock cycles in succession;

halting the transfer of data after said predetermined number of clock cycles;

initiating a SDRAM refresh cycle after said halting;

resuming said transferring data in bursts upon receipt of a done signal after said refresh cycle.

3. A method of executing bulk transfers as in claim 1 including establishing a starting address for said bulk transfer in said memory controller and incrementing said starting address by one on each clock cycle.

4. A method of executing bulk transfers as in claim 2 including establishing a starting address for said bulk transfer in said memory controller and incrementing said starting address by one on each clock cycle.

5. A method of executing bulk transfers as in claim 1 wherein a data word is transferred on each clock cycle.

6. A method of executing bulk transfers as in claim 2 wherein a data word is transferred on each clock cycle.

* * * * *